United States Patent
Lotito et al.

(10) Patent No.: US 9,780,266 B2
(45) Date of Patent: Oct. 3, 2017

(54) STABILIZED QUANTUM DOT STRUCTURE AND METHOD OF MAKING A STABILIZED QUANTUM DOT STRUCTURE

(71) Applicant: Cree, Inc., Durham, NC (US)

(72) Inventors: Kenneth Lotito, Santa Barbara, CA (US); Ryan Gresback, Santa Barbara, CA (US); Paul Fini, Santa Barbara, CA (US); James Ibbetson, Santa Barbara, CA (US); Bernd Keller, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 3 days.

(21) Appl. No.: 15/196,906

(22) Filed: Jun. 29, 2016

(65) Prior Publication Data

US 2017/0005241 A1    Jan. 5, 2017

Related U.S. Application Data

(60) Provisional application No. 62/186,698, filed on Jun. 30, 2015.

(51) Int. Cl.
*H01L 33/50*   (2010.01)
*H01L 33/52*   (2010.01)
(Continued)

(52) U.S. Cl.
CPC .............. *H01L 33/505* (2013.01); *B82B 1/00* (2013.01); *B82B 3/00* (2013.01); *C09K 11/02* (2013.01);
(Continued)

(58) Field of Classification Search
CPC ..... H01L 2224/48091; H01L 2924/181; H01L 33/06; H01L 2224/48247;
(Continued)

(56) References Cited

U.S. PATENT DOCUMENTS 6,350,041 B1   2/2002  Tarsa et al.
7,358,525 B2*  4/2008  Lee .................. B82Y 10/00
                                          257/13
(Continued)

FOREIGN PATENT DOCUMENTS

GB       2472541 A       2/2011
WO    WO 2013/175317 A1  11/2013
(Continued)

OTHER PUBLICATIONS

Aubert, Tangi et al., "Bright and Stable CdSe/CdS@SiO$_2$ Nanoparticles Suitable for Long-Term Cell Labeling", *ACS Applied Materials & Interfaces*, 6, 14 (2014), pp. 11714-11723 (Abstract only).

(Continued)

*Primary Examiner* — Bac Au
(74) *Attorney, Agent, or Firm* — Brinks Gilson & Lione

(57) ABSTRACT

A stabilized quantum dot structure for use in a light emitting diode (LED) comprises, according to one embodiment, a luminescent particle comprising one or more semiconductors, a buffer layer overlying the luminescent particle, where the buffer layer comprises an amorphous material, and a barrier layer overlying the buffer layer, where the barrier layer comprises oxygen, nitrogen and/or carbon. According to another embodiment, the stabilized quantum dot structure includes a luminescent particle comprising one or more semiconductors, and a treated buffer layer comprising amorphous silica overlying the luminescent particle, where the stabilized quantum dot structure exhibits a quantum yield of at least about 0.7 when exposed to a blue light flux of about 30 W/cm$^2$ at a temperature of 80-85° C. and relative humidity of 5% for 500 hours.

14 Claims, 12 Drawing Sheets

(51) Int. Cl.
  *H01L 33/48* (2010.01)
  *H01L 33/60* (2010.01)
  *B82B 1/00* (2006.01)
  *B82B 3/00* (2006.01)
  *C09K 11/02* (2006.01)
  *C09K 11/56* (2006.01)
  *C09K 11/88* (2006.01)

(52) U.S. Cl.
  CPC .......... *C09K 11/565* (2013.01); *C09K 11/883* (2013.01); *H01L 33/483* (2013.01); *H01L 33/502* (2013.01); *H01L 33/52* (2013.01); *H01L 33/60* (2013.01); *H01L 2224/48091* (2013.01); *H01L 2224/48247* (2013.01); *H01L 2924/181* (2013.01); *H01L 2933/0041* (2013.01)

(58) Field of Classification Search
  CPC .......... H01L 2933/0041; H01L 33/483; H01L 33/502; H01L 33/505; H01L 33/52; B82B 1/00; B82B 3/00; C09K 11/02; C09K 11/565; C09K 11/883
  See application file for complete search history.

(56) References Cited

U.S. PATENT DOCUMENTS

| | | | |
|---|---|---|---|
| 7,614,759 B2 | 11/2009 | Negley | |
| 7,842,385 B2* | 11/2010 | Jang | B82Y 20/00 257/103 |
| 7,867,557 B2 | 1/2011 | Pickett et al. | |
| 8,425,071 B2 | 4/2013 | Ruud et al. | |
| 8,563,339 B2 | 10/2013 | Tarsa et al. | |
| 8,591,062 B2 | 11/2013 | Hussell et al. | |
| 8,596,819 B2 | 12/2013 | Negley et al. | |
| 8,622,584 B2 | 1/2014 | Kinnune et al. | |
| 8,624,271 B2 | 1/2014 | Reiherzer et al. | |
| 8,777,449 B2 | 7/2014 | Van De Ven et al. | |
| 8,859,442 B2 | 10/2014 | Naasani et al. | |
| 8,957,401 B2 | 2/2015 | Pickett et al. | |
| 9,028,087 B2 | 5/2015 | Wilcox et al. | |
| 9,048,396 B2 | 6/2015 | Lowes et al. | |
| 9,070,850 B2 | 6/2015 | Keller et al. | |
| 2007/0141726 A1* | 6/2007 | Ying | B82Y 15/00 436/525 |
| 2008/0173884 A1 | 7/2008 | Chitnis et al. | |
| 2008/0179611 A1 | 7/2008 | Chitnis et al. | |
| 2012/0051041 A1 | 3/2012 | Edmond et al. | |
| 2012/0280261 A1 | 11/2012 | Tarsa et al. | |
| 2012/0327650 A1 | 12/2012 | Lay et al. | |
| 2013/0039859 A1* | 2/2013 | Qu | B82Y 10/00 424/9.6 |
| 2013/0341590 A1 | 12/2013 | Gupta et al. | |
| 2014/0117311 A1* | 5/2014 | Kurtin | H01L 29/127 257/22 |
| 2014/0264257 A1* | 9/2014 | Hughes | C09K 11/02 257/13 |
| 2014/0306179 A1* | 10/2014 | Demir | H01L 51/502 257/13 |
| 2014/0347885 A1 | 11/2014 | Wilcox et al. | |
| 2014/0355302 A1 | 12/2014 | Wilcox et al. | |
| 2015/0024543 A1 | 1/2015 | Harris et al. | |
| 2015/0053914 A1 | 2/2015 | Kurtin et al. | |
| 2015/0108524 A1 | 4/2015 | Pickett et al. | |
| 2015/0253488 A1 | 9/2015 | Wilcox et al. | |
| 2015/0362168 A1 | 12/2015 | Power et al. | |
| 2016/0333268 A1* | 11/2016 | Carillo | H01L 33/502 |
| 2017/0092805 A1* | 3/2017 | Carillo | H01L 33/06 |

FOREIGN PATENT DOCUMENTS

| | | |
|---|---|---|
| WO | WO 2014/070423 A1 | 5/2014 |
| WO | WO 2014/093391 A2 | 6/2014 |
| WO | WO 2014/140866 A2 | 9/2014 |
| WO | WO 2015/026464 A1 | 2/2015 |
| WO | WO 2015/036762 A1 | 3/2015 |

OTHER PUBLICATIONS

Aubert, Tangi et al., "Bright and Stable CdSe/CdS@$SiO_2$ Nanoparticles Suitable for Long-Term Cell Labeling", 6th Conference on Nanoscience with Nanocrystals (2014),1 page (Poster presentation).

Chen, Ou et al., "Compact high-quality CdSe-CdS core-shell nanocrystals with narrow emission linewidths and suppressed blinking", *Nature Materials*, 12, 5 (Feb. 3, 2013) pp. 445-451.

* cited by examiner

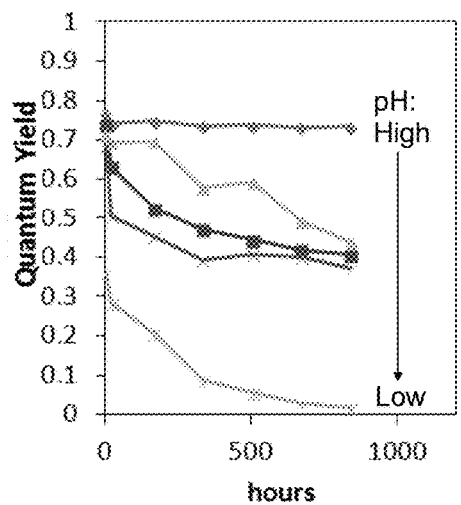
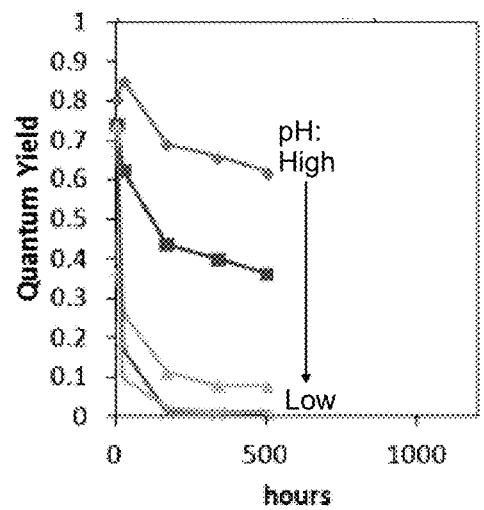
FIG. 6A
FIG. 6B
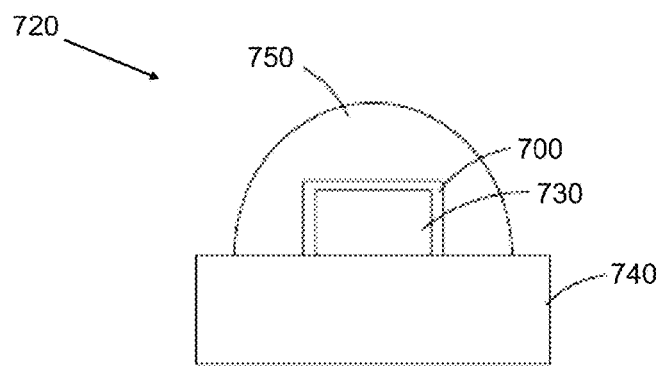
FIG. 7A

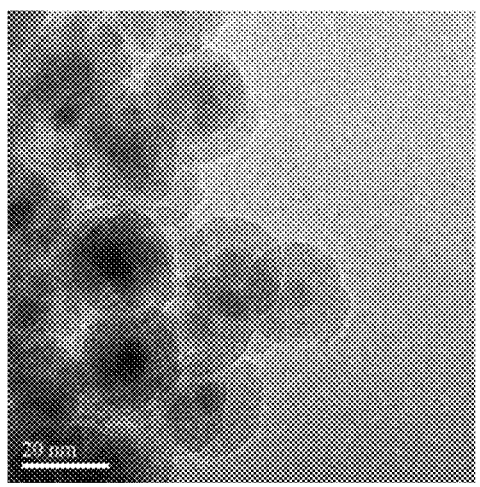
FIG. 13A
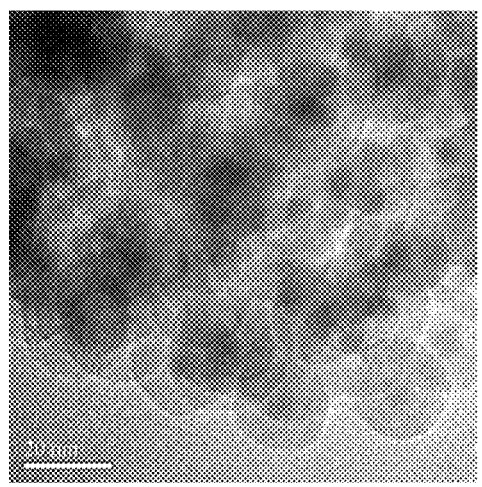
FIG. 13B
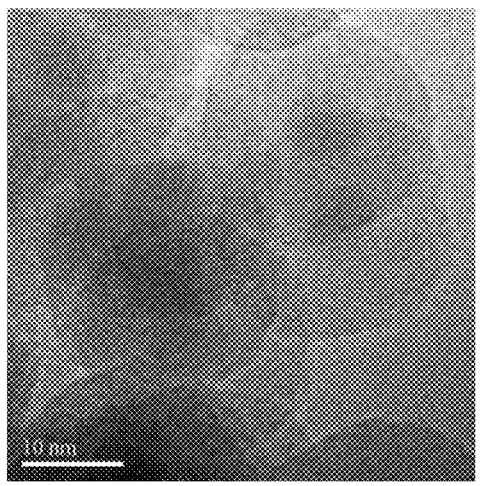
FIG. 13C
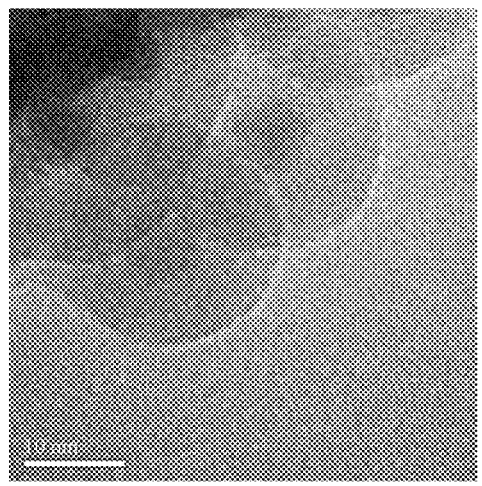
FIG. 13D
FIG. 14
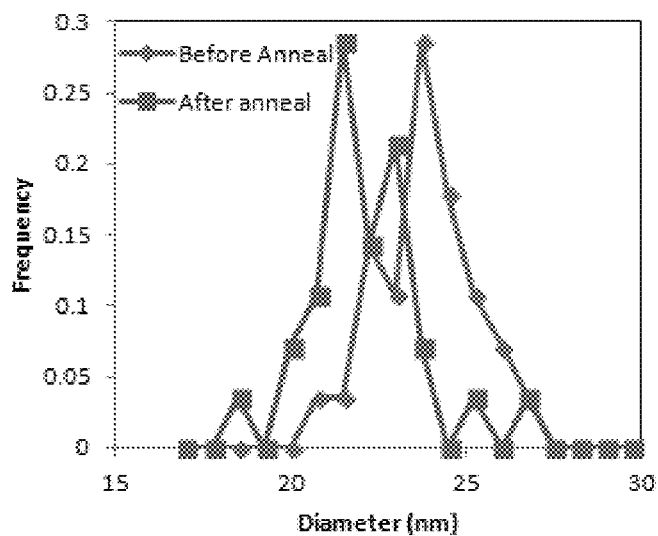

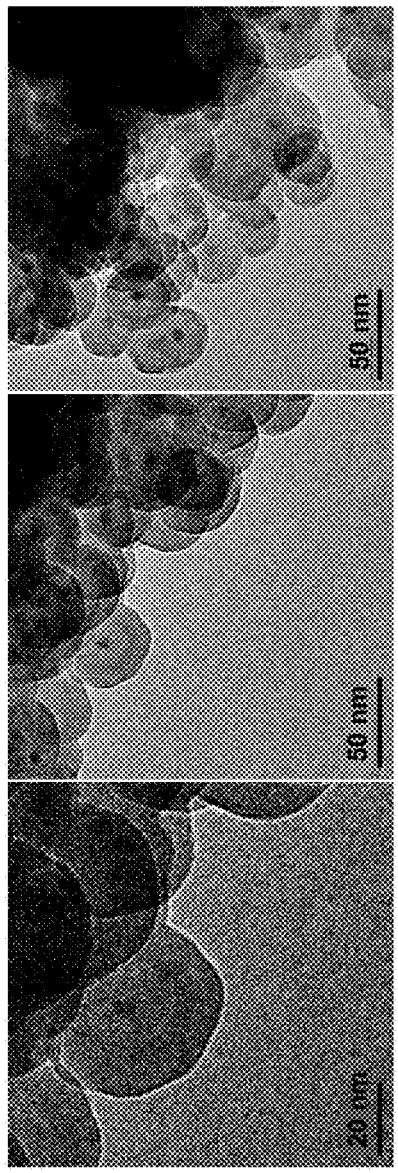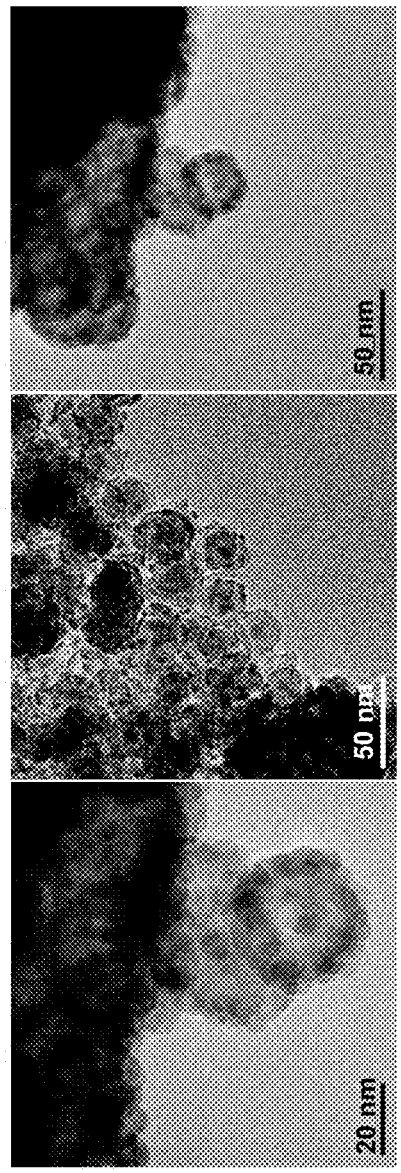

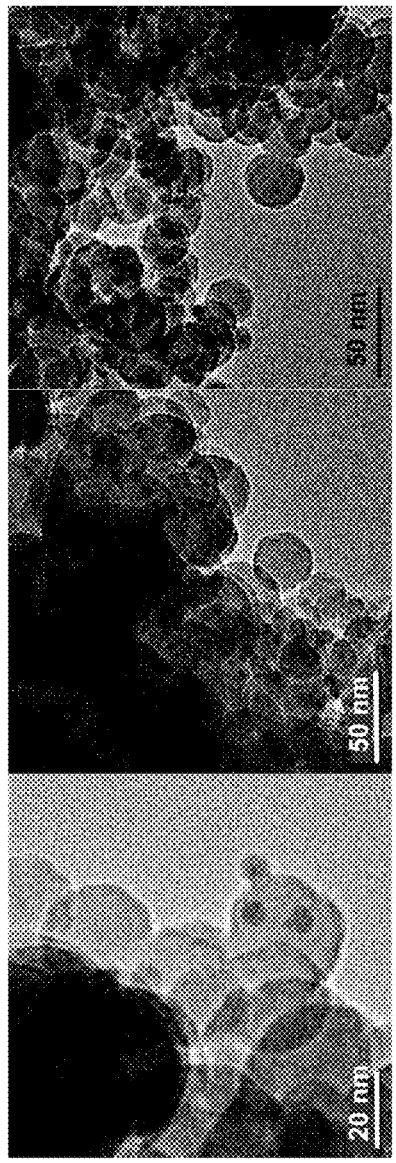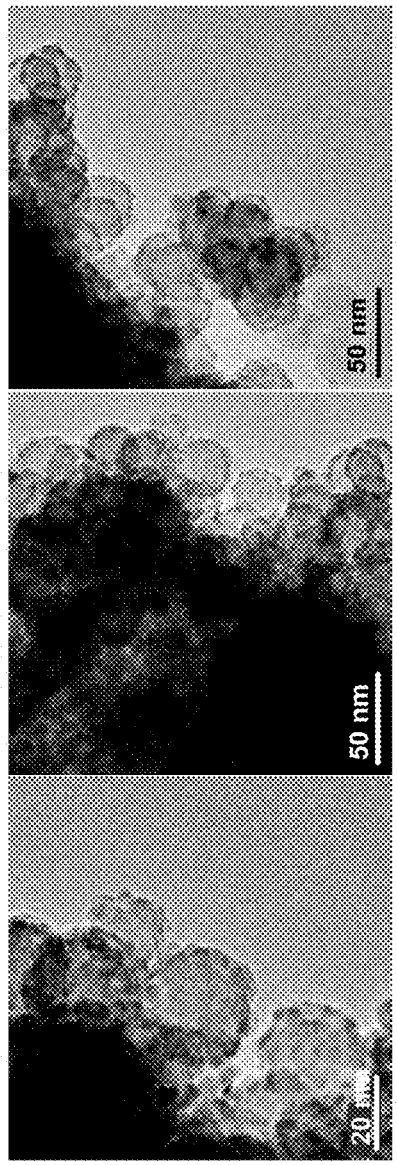

STABILIZED QUANTUM DOT STRUCTURE AND METHOD OF MAKING A STABILIZED QUANTUM DOT STRUCTURE

RELATED APPLICATION

The present patent document claims the benefit of priority under 35 U.S.C §119(e) to U.S. Provisional Patent Application No. 62/186,698, which was filed on Jun. 30, 2015, and is hereby incorporated by reference in its entirety.

TECHNICAL FIELD

The present disclosure is related generally to light emitting devices, and more particularly to stabilized quantum dot structures for lighting and display applications.

BACKGROUND

Luminescent quantum dots show promise as tunable, narrow-band light down-converters to complement and replace conventional phosphors. A down-converting quantum dot or phosphor can absorb light of a given wavelength (e.g., blue) and emit light at a longer wavelength (e.g., red). One of the principal limitations of quantum dots as down-converters for lighting and display applications is their instability under conditions of high light flux and/or elevated temperatures, especially in the presence of environmental oxygen and moisture. Exposure to such oxidative and hydrolytic conditions may lead to progressive decomposition of the quantum dot structure, degradation of down-conversion efficiency, and spectral changes in the down-converted light.

BRIEF SUMMARY

A stabilized quantum dot structure that may exhibit excellent stability during use in a light emitting device has been developed.

According to one embodiment, the stabilized quantum dot structure comprises a luminescent particle comprising one or more semiconductors, a buffer layer overlying the luminescent particle, where the buffer layer comprises an amorphous material, and a barrier layer overlying the buffer layer, where the barrier layer comprises oxygen, nitrogen and/or carbon.

According to another embodiment, the stabilized quantum dot structure comprises a luminescent particle comprising one or more semiconductors, and a buffer layer overlying the luminescent particle, where the buffer layer includes an amorphous material and an additional chemical species for stabilizing the quantum dot structure.

According to another embodiment, the stabilized quantum dot structure includes a luminescent particle comprising one or more semiconductors, and a treated buffer layer comprising amorphous silica overlying the luminescent particle, where the stabilized quantum dot structure exhibits a quantum yield of at least about 0.7 when exposed to a blue light flux of about 30 W/cm$^2$ at a temperature of 80-85° C. and relative humidity of 5% for 500 hours.

A method of making a stabilized quantum dot structure comprises: forming a luminescent particle comprising one or more semiconductors; forming a buffer layer comprising an amorphous material on the luminescent particle, thereby creating a coated luminescent particle; and forming a barrier layer comprising oxygen, nitrogen and/or carbon on the coated luminescent particle to enhance the stability thereof, thereby forming a stabilized quantum dot structure.

A method of making a stabilized quantum dot structure comprises: forming a luminescent particle comprising one or more semiconductors; forming a buffer layer comprising an amorphous material on the luminescent particle, thereby creating a coated luminescent particle; and treating the coated luminescent particle to enhance the stability thereof and form a stabilized quantum dot structure, wherein the stabilized quantum dot structure exhibits a quantum yield of at least about 0.7 when exposed to a blue light flux of about 30 W/cm$^2$ at a temperature of 80-85° C. and relative humidity of 5% for 500 hours.

The terms "comprising," "including," "containing" and "having" are used interchangeably throughout this disclosure as open-ended terms to refer to the recited elements (or steps) without excluding unrecited elements (or steps).

BRIEF DESCRIPTION OF THE DRAWINGS

FIGS. 6A-6B show the quantum yield of stabilized luminescent particles coated with a treated layer that comprises amorphous silica and an ionic species (K) due to a pH treatment, where it can be seen that improved stability over time is achieved for higher pH treatments, where initial pH values ranged from a high of 11.8 to 2.0.

FIG. 7A shows an exemplary light emitting device comprising an LED chip in optical communication with the stabilized quantum dot structure of any of the embodiments in this disclosure.

FIGS. 13A and 13C show TEM images of untreated (nonannealed) coated luminescent particles, and FIGS. 13B and 13D show TEM images of treated coated luminescent particles (post-annealing).

FIG. 14 is a plot of particle size distribution before and after annealing as determined by analyzing TEM images.

FIGS. 17A-17C show TEM images of stabilized quantum dot structures comprising CdSe/CdS/SiO$_x$/Al$_2$O$_3$, where the Al$_2$O$_3$ barrier layer is produced by a vapor phase coating process (atomic layer deposition (ALD)).

FIGS. 18A-18C show TEM images of stabilized quantum dot structures comprising CdSe/CdS/SiO$_x$/ZnO, where the ZnO barrier layer is produced by ALD.

FIGS. 19A-19C show TEM images of quantum dot structures comprising a mixture of CdSe/CdS/ZnS and SiO$_x$/Al$_2$O$_3$, where the Al$_2$O$_3$ barrier layer is produced by ALD.

FIGS. 20A-20C show TEM images of stabilized quantum dot structures comprising CdSe/CdS/ZnS/SiO$_x$/ZnO, where the ZnO barrier layer is produced by ALD.

DETAILED DESCRIPTION

Definitions

Figure 1:
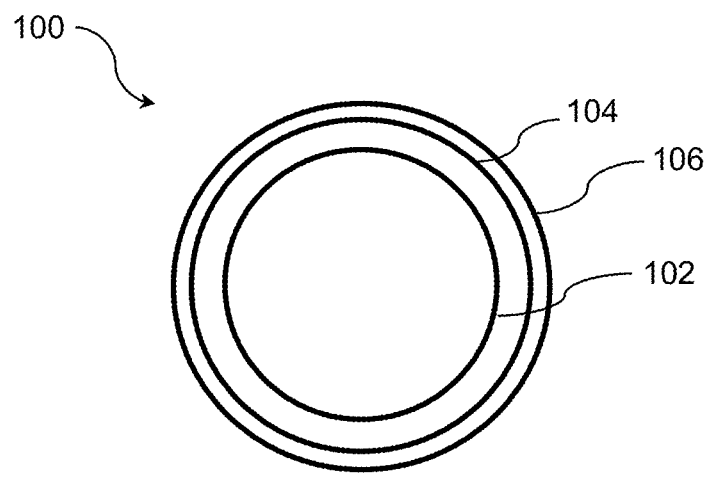
FIG. 1 is a schematic showing a first embodiment of the stabilized quantum dot structure.

A first device that is described as being "in optical communication with" a second device may be understood to be positioned such that light from the first device reaches the second device, or vice versa.

"Dominant wavelength" refers to the wavelength of light that has the same apparent color as the light emitted from an LED, as perceived by the human eye. The dominant wavelength differs from peak wavelength in that the dominant wavelength takes into account the sensitivity of the human eye to different wavelengths of light.

A quantum dot structure may be described using slash mark notation (e.g., "x/y/z"), where x may be understood to be a core or a layer underlying y, which may be understood to be a layer underlying z. Stated differently, z may be understood to be a layer that partially or fully overlies or surrounds y, which may be understood to be a layer that partially or fully overlies or surrounds x.

It is understood that when an element such as a layer, region, or substrate is referred to as being "on" another element, it can be directly on the other element or intervening elements may also be present. Furthermore, relative terms such as "inner," "outer," "upper," "above," "over," "overlying," "beneath," "below," "top," "bottom," and similar terms, may be used herein to describe a relationship between elements. It is understood that these terms are intended to encompass orientations of the device that differ from those depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

The figures are intended as schematic illustrations. As such, the actual dimensions and shapes of the devices and components (e.g., layer thicknesses) can be different, and departures from the illustrations as a result of, for example, manufacturing techniques and/or tolerances may be expected. Embodiments should not be construed as limited to the particular shapes of the regions illustrated herein but are to include deviations in shapes that result from, for example, manufacturing. A region illustrated or described as square or rectangular may have rounded or curved features due to normal manufacturing tolerances. Thus, the regions illustrated in the figures are schematic in nature and their shapes are not intended to illustrate the precise shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Described herein are various embodiments of a stabilized quantum dot structure that has improved reliability under high light flux and/or elevated temperature conditions. The stabilized quantum dot structure may be resistant to decomposition induced by environmental oxygen and moisture over a long operating lifetime (e.g., >10,000 hours).

Referring to FIG. 1, the stabilized quantum dot structure 100 includes a luminescent particle 102 comprising one or more semiconductors. A buffer layer 104 comprising an amorphous material overlies the luminescent particle 102, and a barrier layer 106 comprising oxygen, nitrogen and/or carbon overlies the buffer layer 104. The oxygen, nitrogen and/or carbon may be understood to be part of a chemical compound, and thus the barrier layer 106 may be said to comprise an oxygen-, nitrogen- and/or carbon-containing compound. For example, the barrier layer 106 may comprise an oxide, a carbide, a nitride, an oxynitride, an oxycarbide, or another compound. The amorphous or non-crystalline structure of the buffer layer 104 may facilitate the continuous, reproducible growth of the barrier layer 106, which is intended to serve as a barrier to gaseous oxygen and moisture. The combination of the buffer and barrier layers can inhibit degradation of the luminescent particle by limiting or excluding environmental species that could otherwise interact with and degrade the surface of the luminescent particle.

According to one embodiment, the buffer layer 104 comprises amorphous silica ($SiO_x$, where $0.5 \leq x \leq 2.5$, e.g., $SiO_2$) and the barrier layer 106 comprises an oxide different from silica. Other suitable amorphous materials for the buffer layer 104 may include, for example, amorphous titanium dioxide, amorphous carbon, amorphous alumina, amorphous silicon oxycarbide, or an amorphous aluminosilicate. In some embodiments, the barrier layer 106 may be a stoichiometric or nonstoichiometric oxide, carbide or nitride compound. Exemplary oxides that may be suitable for the barrier layer 106 include semiconducting oxides, such as zinc oxide, titanium dioxide, indium oxide, tin oxide, nickel oxide and copper oxide, conducting oxides, such as indium-tin oxide, aluminum-doped zinc oxide, and gallium-doped zinc oxide, or insulating oxides, such as aluminum oxide, zirconium oxide or hafnium oxide. Suitable carbides may include silicon carbide or boron carbide, and suitable nitrides may include silicon nitride, gallium nitride, boron nitride, or aluminum nitride.

Preparation of an oxide coating directly on the surface of the semiconducting luminescent particle has been difficult or impossible due at least in part to the dissimilarity in lattice constant and/or crystal structure between the oxide and the semiconductor. This dissimilarity may give rise to unfavorable strain and/or surface energy conditions that can prevent the oxide from reproducibly coating the luminescent particles. Under typical liquid-phase growth conditions, the inventors have observed that oxides tend to form discrete particles and/or a partial coating instead of a continuous coating on the semiconductor surface. The presence of a buffer layer comprising an amorphous material is believed to provide a suitable interface for continuous growth of the oxide, or of another material such as a carbide or nitride compound.

Figure 2:
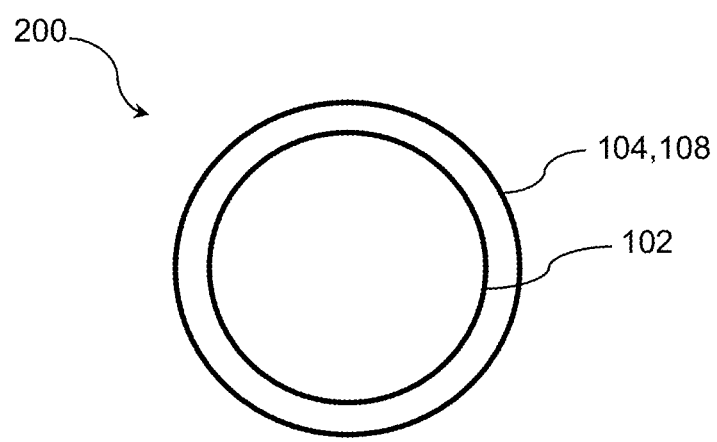
FIG. 2 is a schematic showing a second embodiment of the stabilized quantum dot structure.

Another embodiment of the stabilized quantum dot structure is shown in FIG. 2. As described above, the stabilized quantum dot structure 200 includes: a luminescent particle 102 comprising one or more semiconductors; and a buffer layer 104 comprising an amorphous material that overlies the luminescent particle 102. In this embodiment, the buffer layer 104 is a treated buffer layer (or "treated layer") 108 that comprises the amorphous material after a stabilization treatment. For example, the treated buffer layer 108 may include the amorphous material and an additional chemical species. In another example, the treated buffer layer 108 may be understood to be an annealed or densified buffer layer, as described in greater detail below.

Figure 15:
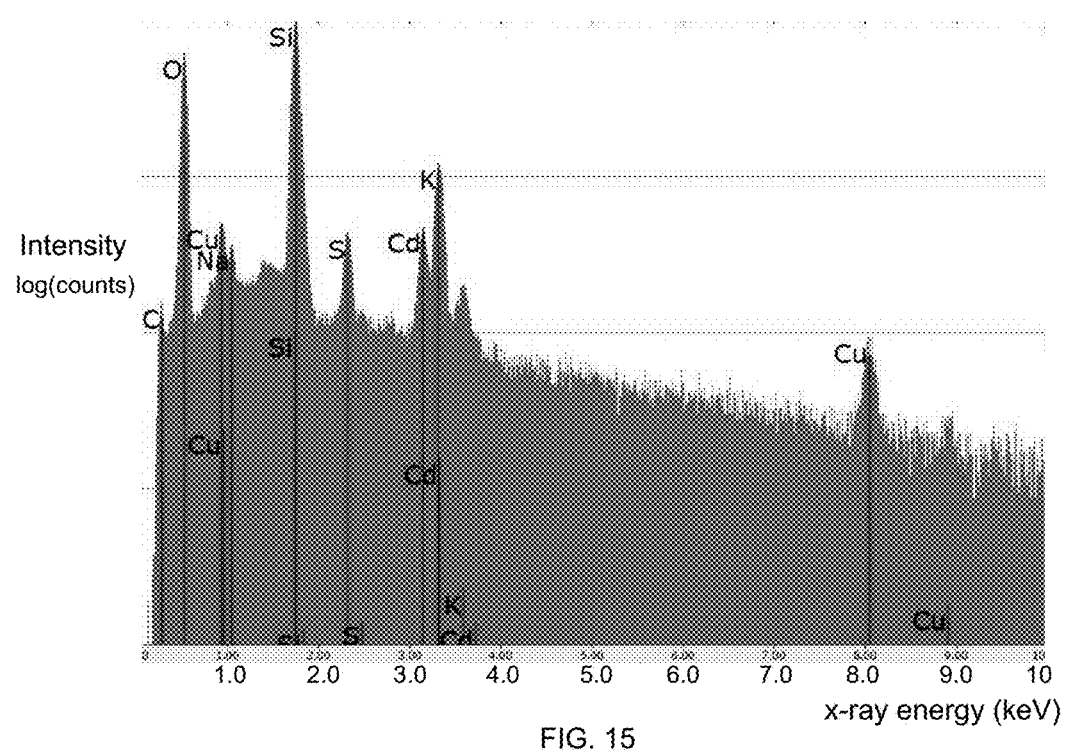
FIG. 15 shows an energy dispersive x-ray spectroscopy (EDX) spectrum for a stabilized quantum dot structure that underwent a pH treatment after formation of the buffer layer.

In the first example, the additional chemical species may be, for example, a dopant or an ionic species such as K and/or Na. Such additional chemical species may be imparted to the buffer layer via a treatment process (e.g., a pH treatment process) as described below. The presence of the additional chemical species may be confirmed by energy dispersive x-ray spectroscopy (EDX), and the technique may in some cases be used to qualitatively estimate the relative amount of the additional chemical species in the buffer layer. For example, referring to the EDX spectrum shown in FIG. 15, the relative intensity of the additional chemical species (K in this example) may be at least about 0.4, at least about 0.5, or at least about 0.6 in comparison with a principal line of one of the buffer layer components (Si or O in this example). The treated buffer layer 108 may in some cases include a silicate salt, such as potassium silicate or sodium silicate, which comprises the ionic species. Also or alternatively, the ionic species may be present as mobile ions in the amorphous material.

In the other example mentioned above, the treated buffer layer 108 may be an annealed or densified buffer layer. In this case, due to the enhanced density of the buffer layer, environmental species such as water and oxygen may be unable to quickly penetrate the buffer layer and the quantum dot structure may exhibit enhanced stability during LED operation. Characteristics of annealed and densified buffer layers are described in greater detail below.

A luminescent particle 102 encapsulated by a treated buffer layer 108 that includes an additional chemical species for stabilization and/or has been densified by annealing may exhibit improved stability (e.g., when exposed to a high light flux at elevated temperatures and/or humid conditions) as compared to a luminescent particle 102 that includes just an untreated buffer layer 104. Accordingly, a barrier layer 106 may not be required on the treated layer 108.

Figure 3:
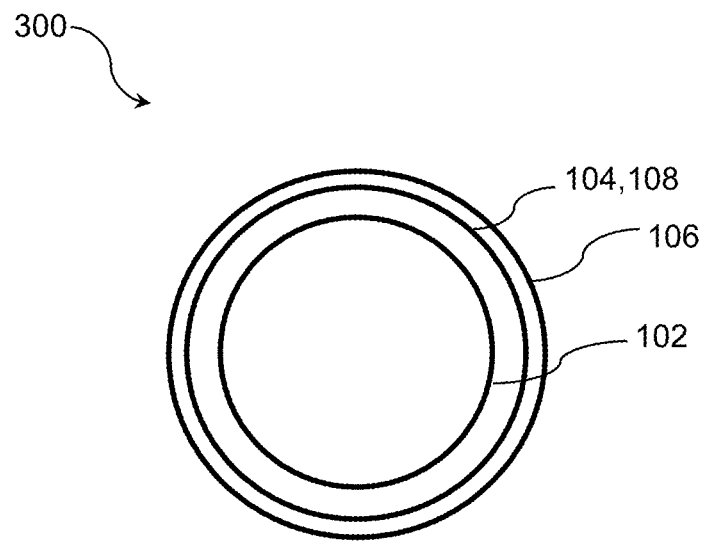
FIG. 3 is a schematic showing a third embodiment of the stabilized quantum dot structure.

Alternatively, referring to the stabilized quantum dot structure 300 of FIG. 3, the treated layer 108 can serve as a buffer layer between the luminescent particle 102 and a barrier layer 106 comprising an oxygen-, carbon- and/or nitrogen-containing compound, as described above. In other words, the barrier layer 106 may overlie the treated layer 108. A quantum dot structure 300 comprising both the treated layer 108 and the barrier layer 106 may exhibit exceptional stability when exposed to oxidative or hydrolytic conditions at elevated temperatures under a high light flux. For example, the graph shown in FIG. 5C reveals that there is an additional enhancement in stability if a barrier layer is deposited on a densified (treated) buffer layer. Comparing the upper curve to the lower curve, the reduced shift in emission peak position as a function of time demonstrates enhanced stability for the quantum dot structure that includes both a treated layer 108 and an overlying barrier layer 106.

Figure 4:
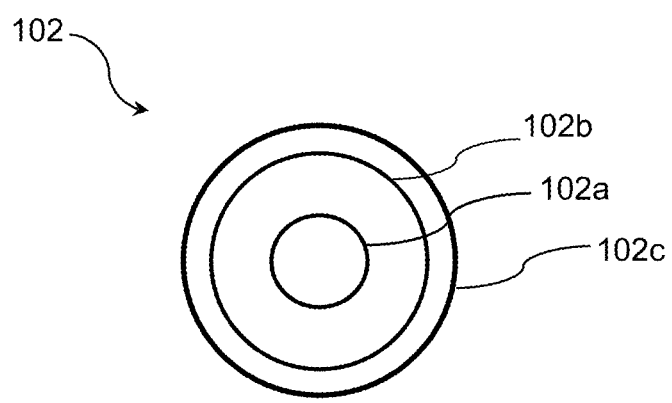
FIG. 4 is a schematic showing an exemplary core-shell structure of a luminescent particle, where in this example the luminescent particle includes a semiconducting core surrounded by a first semiconducting shell and a second semiconducting shell.

Referring now to FIG. 4, the luminescent particle 102 of any of the above-described embodiments may have a core-shell structure including a semiconducting core 102a comprising a first semiconductor and a first semiconducting shell 102b overlying the core 102a that comprises a second semiconductor. The semiconducting core 102a may function as a light emission center and the first semiconducting shell 102b may function as an absorption enhancer. In one example, the first semiconductor may comprise a Group II-VI semiconductor such as CdSe and the second semiconductor may comprise CdS. The luminescent particle may further comprise a second semiconducting shell 102c overlying the first semiconducting shell 102b and comprising a third semiconductor. The second semiconducting shell 102c may serve as a high-quality, essentially defect-free separation layer and may comprise, in one example, ZnS. Each of the first, second and/or third semiconductors may be different from each other and may be single-crystalline or polycrystalline.

Constraining the particle (or crystallite) size of a semiconducting material to a few to tens of nanometers (i.e., close to or less than the exciton Bohr radius) is called quantum confinement; electronic carriers within these so-called quantum dots are spatially restricted. Discrete energy levels may appear, in contrast to the continuous bands of allowed energies in bulk semiconductors, and the bandgap energy is increased. The smaller the particle size—and thus the more severe the confinement—the greater the increase. Thus, the emission wavelength may be controlled by varying the size of the quantum dot (i.e., luminescent particle), where larger particle sizes are associated with a red-shift of the emission. For light emitting diode applications, it is advantageous that the luminescent particle absorbs blue light and down-converts the blue light to a longer emission wavelength (e.g., green, yellow or red). As indicated above, the first shell 102b may function as an absorption enhancer and thus may be engineered for the absorbance of blue light, while the semiconducting core 102a may function as the light emission center and may be optimized for down conversion to a particular wavelength (e.g., red). Typically, the semiconducting core 102a may have a size of from about 1.5 nm to about 5 nm, and the first semiconducting shell 102b may have a thickness of from about 0.5 nm to about 20 nm. When present, the second semiconducting shell 102c may have a thickness of from about 0.5 nm to about 20 nm. The luminescent particle 102 has a linear size (e.g., width or diameter) of less than 100 nm, and typically the linear size is less than 50 nm, or less than 20 nm. Due to the nanoscale size, the luminescent particle 102 may be referred to as a luminescent nanoparticle.

Alternatively, the luminescent particle 102 may not have a core-shell structure and may instead comprise a (single) semiconducting material or a phosphor material. The semiconducting or phosphor material may be a down-converter of blue or UV wavelengths of light, and may further be single-crystalline or polycrystalline.

The untreated or treated buffer layer 104,108 and/or the barrier layer 106 may be substantially transparent to visible light. Typically, the barrier layer 106 has an average thickness of from about 2 nm to about 50 nm. Similarly, the buffer layer comprising the amorphous material may have an average thickness of from about 2 nm to about 50 nm. In some cases, the buffer layer and/or the barrier layer may have a larger thickness of up to about 1 micron, or up to about 500 nm (e.g., from about 2 nm to about 500 nm, or from about 2 nm to about 100 nm). Advantageously, both the buffer layer and the barrier layer are continuous layers that fully surround the underlying layer. In some cases, however, one or both of the buffer layer and the barrier layer may be partial layers that do not fully surround the underlying layer. In the case of the buffer layer, the underlying layer is the luminescent particle, and in the case of the barrier layer, the underlying layer is the buffer layer.

Figure 5A:
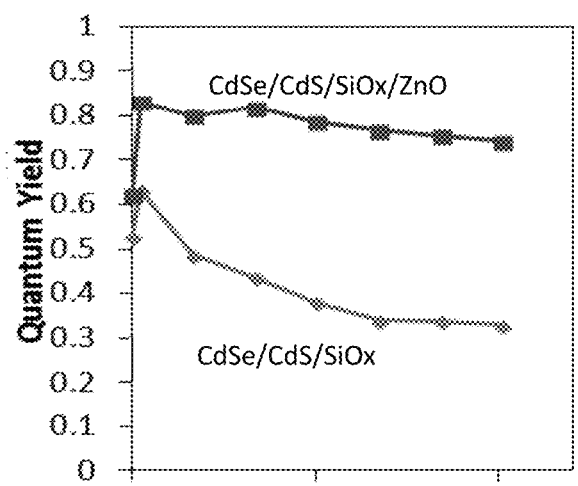
FIGS. 5A and 5B show the quantum yield (QY) and the change from peak QY of (upper data) stabilized luminescent particles coated with a buffer layer comprising untreated amorphous silica and a barrier layer comprising zinc oxide (CdSe/CdS/SiO$_x$/ZnO) compared to (lower data) luminescent particles that do not include the zinc oxide barrier layer on the untreated silica buffer layer (CdSe/CdS/SiO$_x$).
Figure 5B:
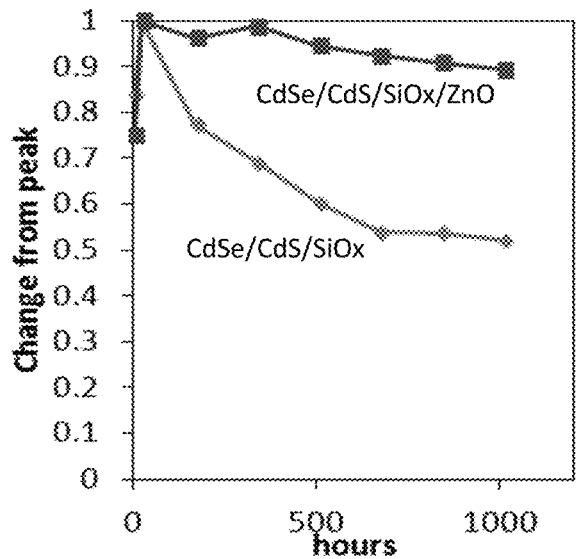
Figure 5C:
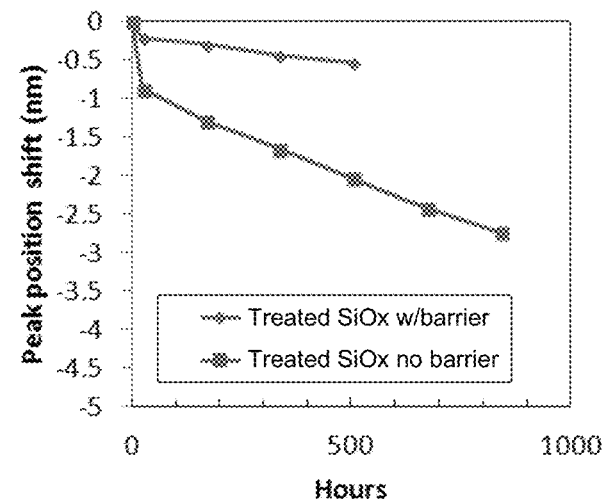
FIG. 5C shows peak position shift as a function of time for (upper data) stabilized luminescent particles coated with a buffer layer comprising treated amorphous silica and a barrier layer comprising Al$_2$O$_3$ compared to (lower data) luminescent particles that do not include the Al$_2$O$_3$ barrier layer on the treated silica buffer layer.

The improved stability of the stabilized quantum dot structure—which may include one or more coatings or layers on a luminescent particle as described above—may be demonstrated by comparing the quantum yield of stabilized and unstabilized quantum dot structures as a function of time. FIGS. 5A and 5B show quantum yield (QY) and change from peak QY as a function of time for (bottom curve) unstabilized quantum dot structures comprising CdSe/CdS/SiO$_x$, where the SiO$_x$ is untreated, and (top curve) stabilized quantum dot structures that include a zinc oxide (ZnO) barrier layer over the CdSe/CdS/(untreated)SiO$_x$ structure. As mentioned previously, FIG. 5C shows the enhanced stability that may be achieved when a barrier layer is deposited on a treated buffer layer (e.g., a buffer layer that has undergone an annealing treatment such as 500° C. for 5 min in nitrogen). The top curve of FIG. 5C is from a stabilized quantum dot structure including a barrier layer on the treated buffer layer, and the bottom curve is from a quantum dot structure without a barrier layer on the treated buffer layer. More specifically, the data are obtained from CdSe/CdS/(treated)SiO$_x$ structures with and without an Al$_2$O$_3$ barrier layer.

Similarly, FIG. 6A shows quantum yield as a function of time for stabilized quantum dots that include a treated buffer layer; in this example, the treated layer is amorphous silica that has received a pH treatment with potassium hydroxide. Initial pH values ranged from a high of 11.8 to 2.0 (11.8, 11.0, 9.0, 5.5, 2.0). The treated layer thus includes an additional ionic species (K) that can be detected by EDX. A stability enhancement is observed for coated luminescent particles that undergo a pH treatment having an initial pH in the range from 10.0 to 12.0, where an initial pH of about 11.0 to 12.0 is preferred. In the examples of both FIGS. 5A and 6A, the quantum dot structure exhibits a quantum yield of at least about 0.7 after exposure to a blue light flux of 30 W/cm$^2$ at a temperature of 80-85° C. and relative humidity of 5% for 500 hours. After exposure to a blue light flux of 30 W/cm$^2$ at a temperature of 80-85° C. and relative humidity of 85% for 500 hours, as shown for example in FIG. 6B, the quantum yield is at least about 0.6.

Quantum yield (QY) may be determined by the spectral output of an LED measured in a calibrated integrating sphere. Quantum yield is the ratio of the sum of downconverted photons to the number of absorbed blue (or source) photons. In one method, the number of blue (source) absorbed photons is determined by measuring a (blue) LED without downconverting material (quantum dot structures (QDs)) and then adding downconverting material and measuring the spectra a second time and taking the difference of the blue photons without quantum dots to the blue photons with downconverting material. In effect, QY=Red photons/[(Blue photons w/o QDs)−(Blue photons with QDs)].

The quantum dot structure according to any of the embodiments described in this disclosure may be used in a light emitting device. For example, referring to the schematic of FIG. 7A, the light emitting device 720 may include a blue light emitting diode (LED) chip 730 having a dominant wavelength of 425 nm to about 475 nm that is in optical communication with a plurality of the quantum dot structures 700 for down conversion of emitted light. In this example, the quantum dot structures 700 are coated on a surface of the blue LED chip 730. The blue LED chip 730 may be disposed on a submount (substrate) 740 and a lens or encapsulant 750 may overlie the LED chip 730, although other submount or package configurations are possible, as described in greater detail below. The quantum dot structures 700 may alternatively be coated on an outer or inner surface of the lens 750 instead of being coated directly on the blue LED chip 730. Likewise, the quantum dot structures 700 may be disposed throughout the volume of the encapsulant 750. More than one type of LED chip (blue and/or other colors) as well as additional phosphors and/or quantum dot structures may be employed in the light emitting device 720.

The light emitting device that includes the stabilized quantum dot structures described herein may have any of a number of different packaging configurations. As is well known in the art, in order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit.

Figure 7B:
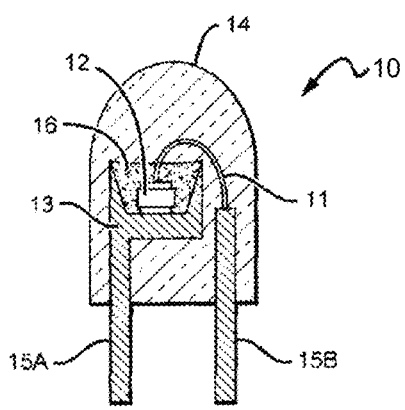
FIGS. 7B-7D show exemplary packaging configurations for a light emitting device including an LED chip and a plurality of the stabilized quantum dot structures.

A typical LED package 10 is illustrated in FIG. 7B. In this example, a single LED chip 12 is mounted on a reflective cup 13 by means of a solder bond or conductive epoxy. One or more wire bonds 11 connect the contacts of the LED chip 12 to leads 15A and/or 15B, which may be attached to or integral with the reflective cup 13. The reflective cup may be filled with an encapsulant material 16 which may contain a wavelength conversion material such as a phosphor and/or the quantum dot structures. The entire assembly is then encapsulated in a protective resin 14, which may be molded in the shape of a lens to collimate the light emitted from the LED chip 12.

Figure 7C:
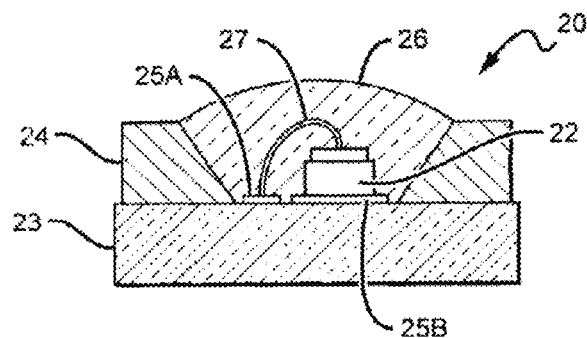

Another conventional LED package 20 is illustrated in FIG. 7C and includes one or more LED chips 22 mounted onto a carrier, such as a printed circuit board (PCB) carrier, as well as leads and a substrate or submount. In this embodiment, a reflector 24 mounted on a submount 23 surrounds the LED chip(s) 22 and reflects light emitted by the LED chip(s) 22 away from the package 20. The reflector 24 also provides mechanical protection to the LED chips 22. One or more wirebond connections 27 may be made between contacts on the LED chips 22 and electrical traces 25A, 25B on the submount 23. The mounted LED chips 22 are then covered with an encapsulant 26, such as a silicone, which may provide environmental and mechanical protection to the chips while also acting as a lens. As described above, the encapsulant may contain wavelength conversion material(s), such as the stabilized quantum dot structures described herein. Other exemplary LEDs comprise LED packages formed of a plastic material that is molded about a lead frame, and the LED chip(s) is mounted in a cavity of the package, and a optically transmissive encapsulant, such as silicone, is dispensed into the cavity over the LED chip(s). Again, wavelength conversion material(s) such as the stabilized quantum dot structures can be dispersed in the encapsulant.

Figure 7D:
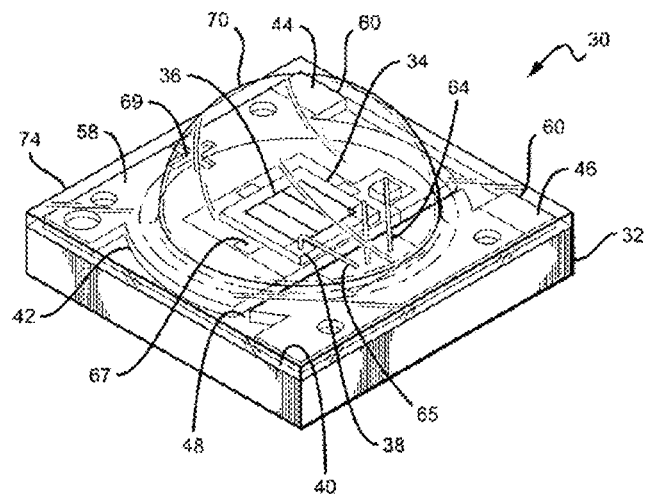

Another exemplary LED package 30 is shown in FIG. 7D and comprises an LED chip 34 on a submount 32 with a molded lens 70, such as a silicone lens, formed over it. The lens 70 can include wavelength conversion material(s), such as the stabilized quantum dot structures described herein, dispersed therein and/or on the LED chip. The LED chip 32 can also be coated by a conversion material that can convert all or most of the light from the LED. The lens can be molded in different shapes, such as hemispherical, planar, chopped or other shapes. An example of such LEDs is described in U.S. Pat. Nos. 9,070,850 and 9,048,396, assigned to the same assignee as the present application and hereby incorporated by reference. It is noted that other reference numbers shown in FIG. 7D are defined in U.S. Pat. No. 9,070,850. Alternative light emitting device designs that include multiple LEDs mounted within a cavity and covered with an encapsulant with wavelength conversion material(s) dispersed therein are described in U.S. Pat. No. 8,624,271, assigned to the same assignee as the present patent application and hereby incorporated by reference.

LED chips generally comprise one or more active layers of semiconductor material sandwiched between oppositely doped layers. When a bias is applied across the doped layers, holes and electrons are injected into the active layer where they recombine to generate light. Light is emitted from the active layer and from various surfaces of the LED. Light is emitted by the LED chip at a primary wavelength. The primary radiation may be absorbed by the wavelength conversion material (e.g., phosphor, stabilized quantum dot structure, etc.), which responsively emits light at secondary wavelength(s). The primary and/or secondary wavelengths of light can mix to produce a desired color of light. As would be understood by one of skill in the art, depending on the primary wavelength(s) and the amount of loading of the wavelength conversion material(s), as well as their light absorption/emission characteristics, various color temperatures of white light can be produced by the LEDs.

The LED chips shown schematically in FIGS. 7A-7D may be Group III nitride-based LED chips whose active region is formed from nitrogen and Group III elements such as aluminum, gallium and/or indium in the form of nitride layers epitaxially grown and doped, as would be understood by one of ordinary skill in the art, to produce light in the green to UV spectral ranges, for example blue light. As illustrated in the preceding examples, a plurality of the quantum dot structures may be incorporated into silicone or another optically transparent encapsulant material and coated onto the LED chip. In other embodiments, the quantum dot structures can be placed in and/or on an encapsulant and/or optic of the LED chip, such as silicone, epoxy or glass. The quantum dot structures may emit at the same or different wavelengths depending on the composition and size of the luminescent particles. Also, phosphors, such as red nitride phosphors and/or green or yellow LuAG or YAG phosphors, can be mixed together with the quantum dot structures in the matrix and/or positioned separately (e.g., in a remote phosphor configuration) on the optic and/or in discrete layers on the LED chip. The result may be a light emitting device that emits warm white light (e.g., 2700K to 4000K) and/or comprises a high CRI (e.g., greater than 90) and/or has an increased gamut.

The LED components, packages and light emitting devices described above may be fabricated using methods known in the art, as described for example in U.S. Patent Application Publication No. 2012/0280261, entitled "Light Emitting Diode (LED) for Achieving an Asymmetric Light Output," which is hereby incorporated by reference. In addition, the blue LED chips may be coated with the aforementioned quantum dot structures or phosphors using any suitable method, such as that described U.S. Patent Application Publication Nos. 2008/0179611 and 2008/0173884, both of which are entitled "Wafer Level Phosphor Coating Method and Devices Fabricated Utilizing Method," and hereby incorporated by reference. As set forth in these patent publications, LED chips can be coated and/or sprayed by phosphors, the stabilized quantum dot structures, and/or other wavelength conversion materials. The LED chips may also be coated using electrophoretic deposition (EPD), such as with the EPD method described in U.S. Pat. No. 8,563,339 to Tarsa et al., entitled "Closed Loop Electrophoretic Deposition of Semiconductor Devices," which is hereby incorporated by reference.

Figure 8A:
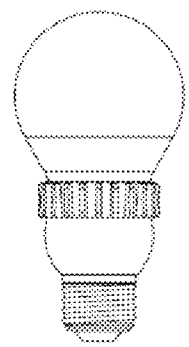
FIGS. 8A-8E show exemplary light fixtures that may utilize the light emitting devices and stabilized quantum dot structures described herein.
Figure 8B:
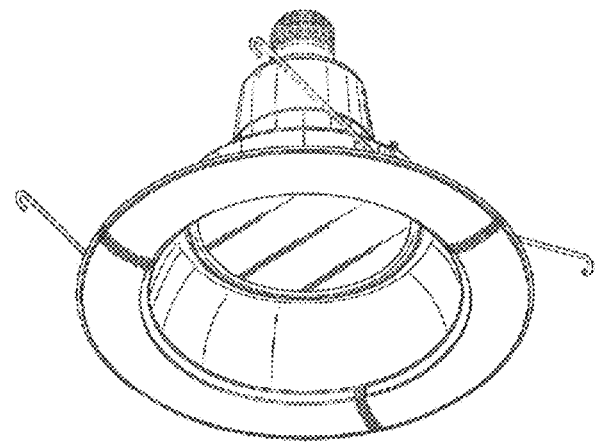
Figure 8C:
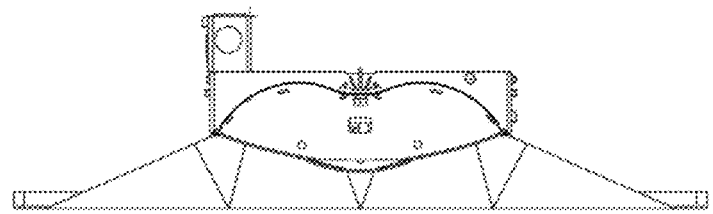
Figure 8D:
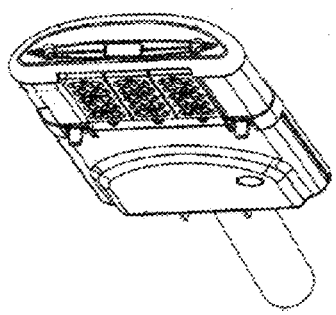
Figure 8E:
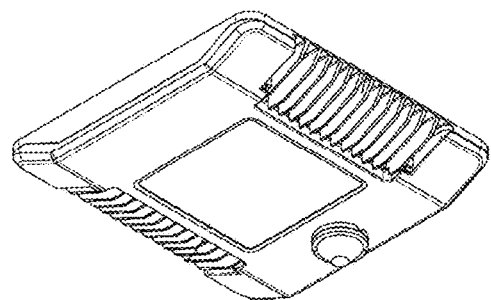

The light emitting devices and the stabilized quantum dot structures described herein may have particular utility with respect to various form factor light fixtures. For example, each of the embodiments disclosed herein may be alternatively implemented in various types of solid state light fixtures including, for example, downlights, troffers, streetlights, canopy lights, parking garage lights, lights that use waveguide technology and other lighting fixtures. FIG. 8A illustrates an omnidirectional light bulb, such as an A19 bulb. Other similar consumer lights, such as PAR, BR and candelabra bulbs, can also implement the light emitting devices described herein. Exemplary lights are described in U.S. Pat. Nos. 8,591,062 and 8,596,819 and U.S. Patent Publication No. 2015/0362168, each of which is hereby incorporated by reference. FIG. 8B shows another downlight that can incorporate light emitting devices described herein. An example of such a downlight is disclosed in U.S. Pat. No. 8,777,449, which is hereby incorporated by reference. FIG. 8C illustrates a troffer light fixture that can incorporate the light emitting devices described herein. An exemplary troffer light fixture is disclosed in U.S. Published Patent Publication No. US2012/0327650, which is hereby incorporated by reference. In another example, FIG. 8D illustrates a solid state streetlight that may include the light emitting devices described herein. Other streetlights and outdoor lighting fixtures that can be implemented using the light-emitting devices described herein include the lights disclosed in U.S. Pat. No. 8,622,584; U.S. Pat. No. 8,425,071; U.S. Pat. No. 9,028,087; and U.S. Patent Publication No. 2015/0253488, each of which is hereby incorporated by reference. Finally, FIG. 8E illustrates a canopy light which is described in U.S. Pat. No. 9,182,096, which is hereby incorporated by reference. Light emitting devices described herein may also be implemented in various other lighting fixtures, such as, for example, in the waveguide-based troffers disclosed in U.S. Patent Publication No. 2014/0347885, in the troffer style fixtures disclosed in U.S. Patent Publication No. 2012/0051041 and/or in the waveguide-based garage lights disclosed in U.S. Patent Publication No. 2014/0355302, each of which is hereby incorporated by reference. Other and similar light fixtures can be implemented using the above-described circuitry.

As known to those skilled in the art, lamps have been developed utilizing solid state light sources, such as LEDs, in combination with a conversion material that is separated from or remote to the LEDs. Such arrangements are disclosed in U.S. Pat. No. 6,350,041, entitled "High Output Radial Dispersing Lamp Using a Solid State Light Source," which is hereby incorporated by reference. Suitable lamps can comprise a solid state light source that transmits light through a separator to a disperser including one or more phosphors and/or stabilized quantum dot structures. The disperser can disperse the light in a desired pattern and/or changes its color by converting at least some of the light to a different wavelength through the phosphor(s), quantum dot structures, and/or other conversion material. In some embodiments, the separator spaces the light source a sufficient distance from the disperser such that heat from the light source will not transfer to the disperser when the light source is carrying elevated currents necessary for room illumination. Additional remote phosphor techniques are described in U.S. Pat. No. 7,614,759, entitled "Lighting Device," which is hereby incorporated by reference.

The present disclosure now returns to the stabilized quantum dot structures, which, as described above, may be incorporated into light emitting devices having any of various packaging, light fixture and lamp configurations, such as those set forth above. Described below is a method of making stabilized quantum dot structures that can exhibit improved stability.

The method comprises forming a luminescent particle comprising one or more semiconductors and forming a buffer layer comprising an amorphous material on the luminescent particle. A coated luminescent particle is thereby created. The coated luminescent particle is treated to form a stabilized quantum dot structure (or "treated coated luminescent particle") that exhibits a quantum yield of at least about 0.7 after exposure to a blue light flux of about 30 W/cm$^2$ at a temperature of 80-85° C. and relative humidity of 5% for 500 hours. Also or alternatively, when exposed to a blue light flux of about 30 W/cm$^2$ at a temperature of 80-85° C. and relative humidity of 85% for 500 hours, the stabilized quantum dot structure may exhibit a quantum yield of at least about 0.6. As discussed below, the treatment may be a pH treatment or a heat treatment.

According to another embodiment, a method of making a stabilized quantum dot structure comprises forming a luminescent particle comprising one or more semiconductors and forming a buffer layer comprising an amorphous material on the luminescent particle, thereby creating a coated luminescent particle. A barrier layer comprising oxygen, carbon and/or nitrogen as described above is formed on the coated luminescent particle to form a stabilized quantum dot structure, which may exhibit a quantum yield of at least about 0.7 when exposed to a blue light flux of about 30 W/cm$^2$ at a temperature of 80-85° C. and relative humidity of 5% for 500 hours. Also or alternatively, when exposed to a blue light flux of about 30 W/cm$^2$ at a temperature of 80-85° C. and relative humidity of 85% for 500 hours, the stabilized quantum dot structure may exhibit a quantum yield of at least about 0.6. In some embodiments, the buffer layer may be a treated buffer layer, as described below and elsewhere in this disclosure.

The treating of the buffer layer to form a treated coated luminescent particle may entail heating (annealing) the coated luminescent particle to an elevated temperature, e.g., from about 100° C. to about 800° C. The anneal may follow purification and drying of the coated luminescent particle, where purification may entail washing to remove any unwanted byproducts and/or "dust" removal. Typically, the annealing takes place at a temperature in the range from about 400° C. to about 800° C. A suitable environment for the annealing may be nitrogen, an inert gas, dry air or another atmosphere (e.g., ambient air or a reactive gas such as hydrogen, forming gas, oxygen, fluorinated gas, etc.). Typically, the annealing is carried out for a duration of about 5 min to about 120 min. In one example, the coated luminescent particle is heated in nitrogen for 5 min at 500° C. After annealing, the luminescent particle is cooled to room temperature. Annealing of the coated luminescent particle is believed to promote densification of the buffer layer, which in turn may lead to a reduction in the atmospheric species (e.g., $H_2O$, $O_2$) that can penetrate the buffer layer and reach the underlying semiconductor(s). Thus, during LED operation, the stabilized quantum dot structure may experience reduced degradation. A description of a possible densification mechanism in the case of a silica buffer layer is set forth below.

Figure 9A:
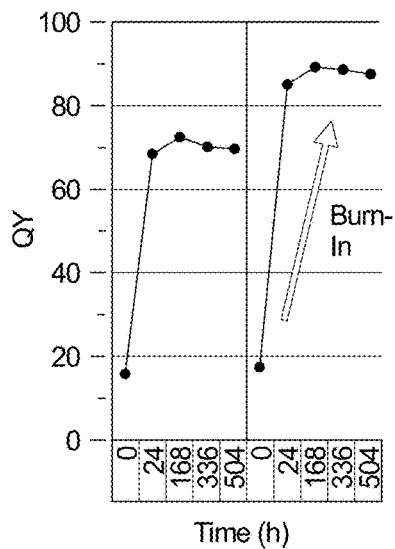
FIG. 9A shows quantum yield as a function of time (from t=0 to 504 hours) for treated coated luminescent particles that have not undergone a pre-burn-in process prior to packaging and operation in an LED component.
Figure 9B:
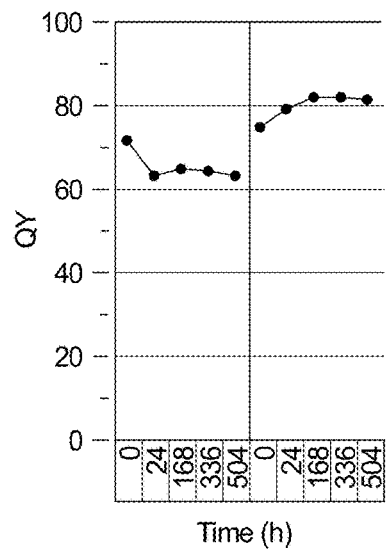
FIG. 9B shows quantum yield as a function of time (from t=0 to 504 hours) for treated coated luminescent particles that have undergone a pre-burn-in process prior to packaging and operation in an LED component.

An effect of the annealing process described above may be a temporary quenching of emission from the treated coated luminescent particle, as shown in FIG. 9A, which depicts quantum yield as a function of time (hours). Emission may be recovered after exposure to a blue light flux during operation (e.g., after incorporating the treated coated luminescent particles into a package for use). Alternatively, a "pre-burn-in" process developed in the present work may be employed so that the quantum dot structures exhibit stable emission immediately upon use. Quenching and recovery of the emission is believed to be rooted in an electronic effect involving charging and discharging of the quantum dots. The pre-burn-in process may entail exposing the treated coated luminescent particles to blue light in an environment including oxygen, such as air or water. For example, after annealing, the treated coated luminescent particles may be: (a) dispersed in water or an aqueous solution; (b) exposed to blue light for about 24 hours; and (c) removed from the water/aqueous solution and dried to a powder. FIG. 9B shows that, after the pre-burn-in process, followed by packaging to form an LED component/light emitting device, the stabilized quantum dot structures may exhibit stable performance from the initial operation (time t=0) of the light emitting device. The packaging may entail procedures known in the art, such as those described in above.

As an alternative to or in addition to annealing, treating the buffer layer may comprise exposing the coated luminescent particle to a treatment solution comprising a predetermined pH. The predetermined pH of the treatment solution may be in the range of from about 6.5 to about 14, with a pH of about 10-12 being typical. The treatment solution may be formed by adding one or both of an acidic aqueous solution and a basic aqueous solution to a suspension including the coated quantum dot structure to achieve the predetermined pH. The acidic aqueous solution may comprise an acid selected from the group consisting of: HCl, HBr, $H_3PO_4$ and $H_2SO_4$, and the basic aqueous solution may comprise a base selected from the group consisting of NaOH, KOH, $NH_4OH$ and $H_2SO_4$. The treatment solution may be heated to a temperature in the range of from about 40° C. to about 100° C. during the exposure of the coated luminescent particle(s). The suspension including the coated luminescent particle(s) may be formed as described below.

In some embodiments, after treating the coated luminescent particle to form the stabilized quantum dot structure, a barrier layer comprising oxygen, carbon and/or nitrogen may be formed on the treated buffer layer. As noted above, the barrier layer may be formed on the treated buffer layer or on an untreated buffer layer. In either case, the formation of the barrier layer may entail a solution phase reaction or a vapor phase reaction.

The solution phase reaction may comprise exposing the coated luminescent particle or stabilized quantum dot structure (e.g., after treating the coated luminescent particle) to a first solution comprising at least one oxide, carbide or nitride precursor ("the precursor(s)"). The exposure may occur at room temperature or at an elevated temperature of from about 25° C. to about 300° C. The precursor(s) may comprise a metal salt such as a metal nitrate, metal acetate or metal chloride. The first solution is typically an aqueous solution and the precursor is typically included at a concentration of 10-500 mg/ml, with 50-150 mg/ml (e.g., 100 mg/ml) being typical. When an aqueous solution is used, the coated luminescent particle may have a polar surface. If the metal oxide coating is formed in a non-polar medium, such as an organic solvent, the coated luminescent particle may have a non-polar surface (e.g., from the intentional introduction of a hydrophobic coating). It is noted that the term "metal oxide" is sometimes used in the present disclosure as an alternative to "oxide" and should not be construed to place any limits on the meaning of "oxide." For example, the terms "metal oxide" and "oxide" may both be used in reference to silica ($SiO_x$), although silicon (Si) is a semiconductor, not a metal. The exposure to the precursor(s) may entail injection or infusion of the first solution comprising the precursor(s) into a heated suspension of coated luminescent particles, or injection or infusion of a suspension of the coated luminescent particles into the first solution at the elevated temperature. Alternatively, the coated luminescent particles may be mixed in the first solution and sealed in a reactor, followed by a gradual increase to the elevated temperature. As the precursor or precursors decompose, the corresponding oxygen-, carbon-, and/or nitrogen-containing compound (e.g., an oxide, carbide or nitride) is added to the surface of the coated luminescent particle in the form of a coating, and thus the barrier layer is formed.

The formation of the barrier layer may further comprise exposing the coated luminescent particle to a second solution comprising an additive, such as an acid, base or buffer, or a surfactant. For example, the second solution may be an aqueous solution, and the additive may be a base such as potassium hydroxide, sodium hydroxide, or ammonium hydroxide at a concentration of 0.1-10 M. The exposure of the coated luminescent particle to the first solution comprising the precursor(s) and the second solution comprising the additive or surfactant may occur simultaneously. The additive or surfactant may help to control the pH of the mixture or the surface properties of the luminescent particle and/or the barrier layer. The exposure to the first and optionally the second solutions to form the barrier layer may occur over a specified period of time, such as between 10 mins and 16 hours, with 30 minutes to 2 hours (e.g., 1 hour) being typical.

The vapor phase reaction for forming the barrier layer may entail a vapor deposition process known in the art, such as atomic layer deposition (ALD) or chemical vapor deposition (CVD). In ALD, the barrier layer is grown on the buffer layer or on the treated buffer layer by exposure to alternate gaseous precursors (e.g., a metal precursor and oxygen precursor). In contrast to chemical vapor deposition, the gaseous precursors are typically not present in the reactor simultaneously, but instead are introduced separately in a series of sequential pulses. The presence of the buffer layer comprising an amorphous material on the surface of the luminescent particle may help prevent degradation of the underlying semiconductor material(s) during vapor deposition.

In the case of a buffer layer comprising silica ($SiO_x$, where $0.5 \leq x \leq 2.5$, e.g., $SiO_2$), the annealing treatment described above for stabilization may lead to the condensation of Si—OH groups to Si—O—Si groups according to the following reaction: Si—OH+Si—OH→Si—O—Si+$H_2O$. Consequently, the silica network may undergo rearrangement and the buffer layer may densify. Due to these structural and chemical changes during annealing, the buffer layer may show an increased number of Si—O—Si bonds compared to Si—OH bonds after annealing. This may be verified experimentally using Fourier transform infrared spectroscopy (FTIR) data, since the vibrational spectra of silica can exhibit predictable changes upon heat treatment.

Figure 10:
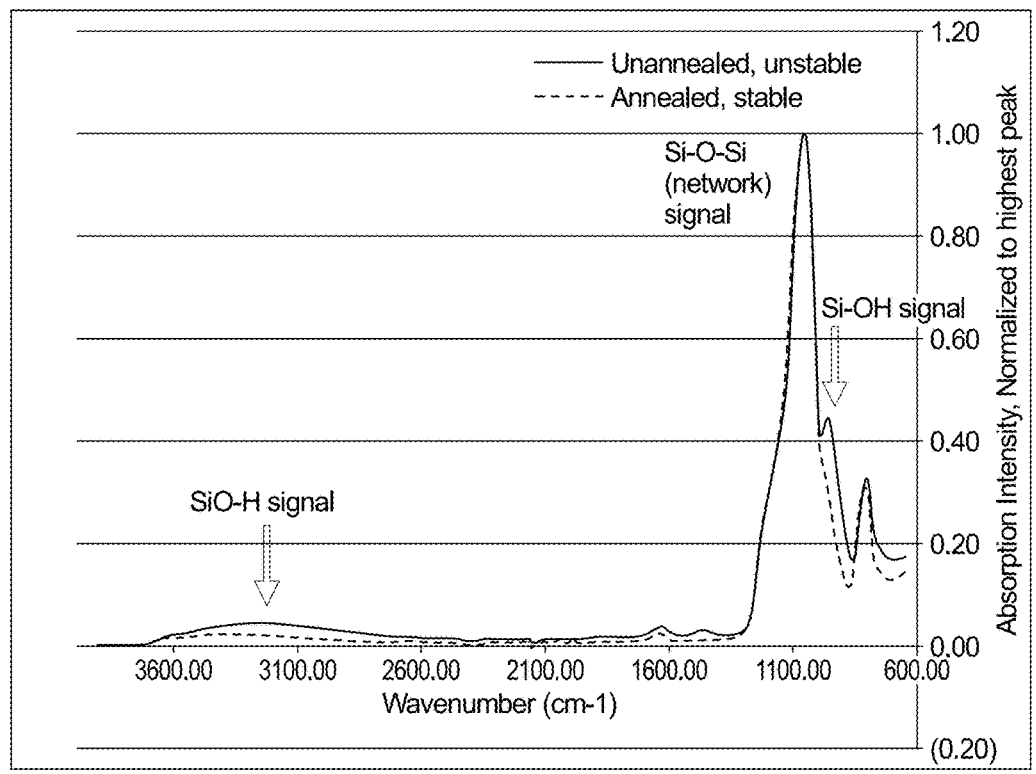
FIG. 10 shows Fourier transform infrared spectroscopy (FTIR) curves obtained from silica-coated luminescent particles before and after annealing.

Referring to FIG. 10, the FTIR spectra obtained from silica-coated luminescent particles may include one or more intensity peaks (spectroscopic signals) that can be attributed to the Si—O—Si network and one or more intensity peaks (spectroscopic signals) that can be attributed to Si—OH (silanol) groups. With progressive heating, the spectroscopic signals attributable to the uncondensed silanol groups are diminished relative to the signals attributable to the condensed Si—O—Si network. As such, the vibrational spectrum of a given sample of silica-coated luminescent particles can be used to gauge the density of the silica buffer layer and provide a semi-quantitative measure of the concentration of uncondensed silanol groups.

For example, after annealing to provide increased density, one or more of the following three salient changes may be observed in the FTIR spectra: (a) the intensity of the silanol (SiO—H) signal at about 3300 $cm^{-1}$ is reduced relative to the network (Si—O—Si) signal at about 1050 $cm^{-1}$; (b) the silanol (Si—OH) peak at about 950 cm is converted from a distinct peak to a shoulder with no observable maximum; and (c) the intensity of the silanol (Si—OH) peak at about 950 $cm^{-1}$ is reduced relative to the network (Si—O—Si) signal at about 1050 $cm^{-1}$. Accordingly, an FTIR spectrum obtained from silica-coated luminescent particles that have been annealed for stabilization may exhibit a peak intensity ratio (R) of at least about 35, where R is equivalent to the intensity at about 1050 $cm^{-1}$ ($I_{1050}$, corresponding to the Si—O—Si network) over the intensity at about 3300 $cm^{-1}$ ($I_{3300}$, corresponding to the uncondensed silanol groups). In other words, $R=I_{1050}/I_{3300} \geq 35$. In some cases, as shown in the Examples below, R may be at least about 40, at least about 45, or at least about 50, and R may also be as high as 75, or as high as 65.

Besides increased density, other changes that may be experienced by the buffer layer during annealing of a coated luminescent particle include a decrease in mass and/or a reduction in thickness, as discussed further in the Examples.

Examples

A luminescent particle having a core-shell structure (either a core/first shell structure (e.g., CdSe/CdS) or a core/first shell/second shell structure (e.g., CdSe/CdS/ZnS), as described above) may be fabricated using methods known in the art or may be obtained commercially from a vendor.

Formation of Buffer Layer

The buffer layer comprising the amorphous material may be formed on the luminescent particle by an inverse micelle condensation reaction using a suitable precursor. When the amorphous material comprises amorphous silica, the precursor may comprise tetraethyl orthosilicate (TEOS), as described in this example.

First, a mixture of heptane, water and a surfactant, such as Brij® L4, is prepared. The heptane, surfactant and water may be combined in volume ratios of approximately 10:5:1, respectively. The surfactant forms micelles of a controlled size surrounding the water (the aqueous or hydrophilic phase) and the heptane (the hydrophobic phase) remains outside the micelles. Luminescent particles, such as CdSe/CdS core-shell particles, are added to the mixture. Typically the luminescent particles are added at a concentration of 0.2-2 nmols per milliliter (0.2-2 nmol/ml) of solution. A base (e.g., 28-30 wt. % ammonia solution) may also be added with a volume ratio of base to water of 1:8. The resulting mixture may be stirred for 10-20 minutes, and then TEOS may be added. The addition of the TEOS may occur all at once, or in small amounts over a period of hours or days. The thickness of the silica coating (the "buffer layer" described above) on the luminescent particle may be controlled by the amount of TEOS added to the mixture.

A likely mechanism of silica growth on the luminescent particle entails exchange of ligands in the mixture and transfer of the luminescent particle from the hydrophobic phase to the hydrophilic phase, where growth of the silica may occur.

pH Treatment of Buffer Layer

Following purification, a powder including coated luminescent particles comprising $CdSe/CdS/SiO_x$ (which may be prepared as described above) is dispersed in a basic aqueous (alkaline) solution. A variety of bases may be used to prepare the alkaline solution including, but not limited to, potassium hydroxide, sodium hydroxide, or ammonium hydroxide. The concentration of base in the solution is typically between 0.01 M and 1.0 M with higher concentrations facilitating dispersal of the coated particles, but potentially etching the $SiO_x$ shell to a greater extent. The coated particle suspensions may be prepared at concentrations <50 mg/ml, with 10 mg/ml being typical. Ultrasonication is usually, but not always, employed to obtain a homogenous suspension. In some cases, the sonication may be carried out for up to several hours.

The suspension including the coated particles is diluted with de-ionized water to a concentration of <5 mg/ml, with 2 mg/ml being typical. The coated particle concentration is preferably kept relatively low to discourage aggregation and flocculation. To this solution, tribasic sodium citrate is optionally added at a concentration of 0.5-10 mg/ml.

The pH may then be adjusted to a desired initial value by addition of an acidic aqueous solution (e.g. HCl, HBr, $H_3PO_4$, $H_2SO_4$) to lower the pH or a basic aqueous solution (e.g. NaOH, KOH, $NH_4OH$, $H_2SO_4$) to raise the pH. The initial pH can range between 6.5-14, with about 11 being typical. A pH buffer may also be added at this stage to better control the pH.

A PTFE-coated magnetic stir bar may be added and the reaction vessel may be sealed (e.g., with a rubber septum). The sealed vessel may be added to an oil bath at the desired reaction temperature, typically between 40° C.-100° C., although the reaction may also be performed at room temperature. The reaction vessel is then allowed to thermally equilibrate, typically for a time duration of about 30 minutes.

FIGS. 6A-6B show the quantum yield of stabilized luminescent particles coated with a treated layer that comprises amorphous silica and an ionic species (K) due to the pH treatment. It can be seen that improved stability is achieved for higher pH treatments.

The presence of an additional chemical species in the treated layer can be verified by EDX, and the relative intensity of the additional chemical species may be used to estimate the qualitative relative amount of the additional chemical species in the buffer layer, as discussed above.

Annealing of Buffer Layer

Figure 11:
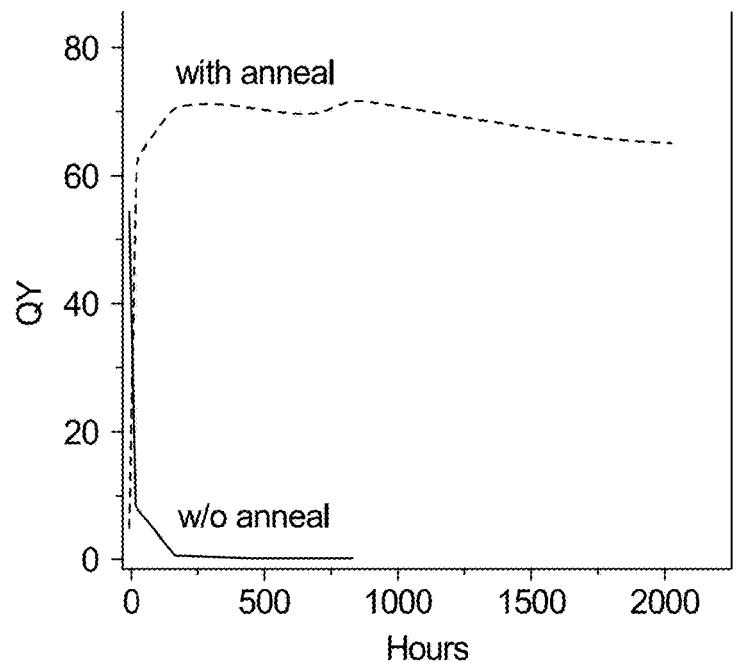
FIG. 11 shows quantum yield as a function of time (hours) for coated luminescent particles (CdSe/CdS/SiO$_x$) with and without an anneal.

A powder including coated luminescent particles comprising $CdSe/CdS/SiO_x$, which may be prepared as described above, is subjected to an annealing treatment to densify the buffer layer ($SiO_x$). The powder is heated for 500° C. for 5 min in a nitrogen atmosphere, and then cooled to room temperature. FIG. 11 shows quantum yield as a function of time (hours) for the exemplary coated luminescent particles with and without the anneal, revealing a drastic increase in stability due to the annealing treatment.

Figure 12:
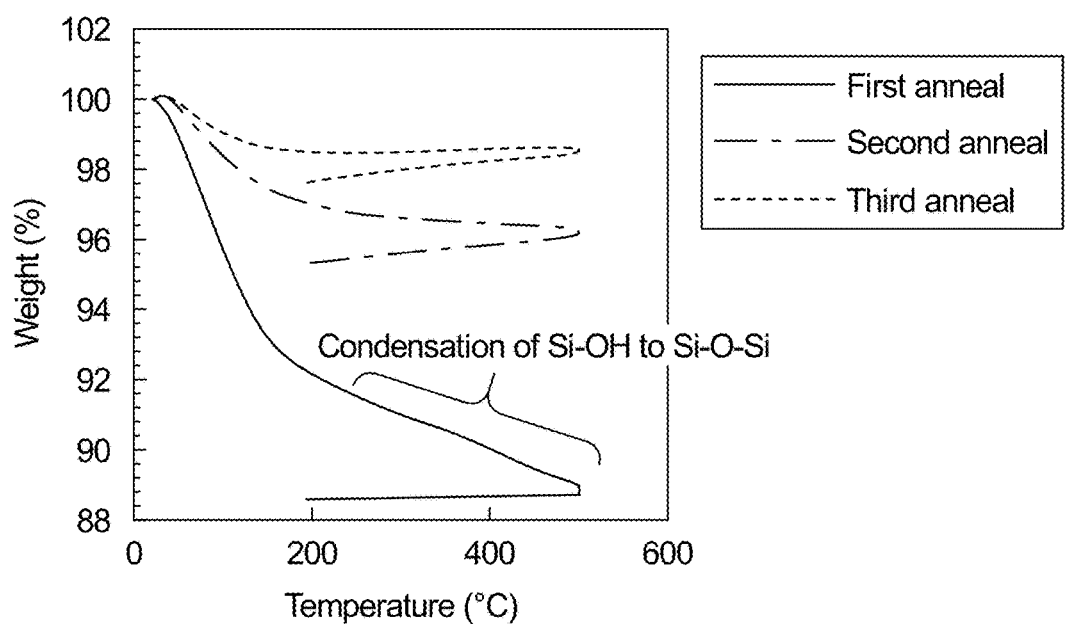
FIG. 12 shows mass loss data for coated luminescent particles (CdSe/CdS/SiO$_x$) as a consequence of annealing.

Densification of the buffer layer as a consequence of annealing is demonstrated by mass loss data obtained for the coated luminescent particles. Referring to FIG. 12, which shows weight (%) as a function of temperature (° C.), three curves are shown which correspond to first, second and third anneals of the coated luminescent particles. The mass loss observed for each of the three curves below about 200° C. is attributed to water vapor and/or other adsorbed atmospheric components. Above 200° C., a fairly substantial mass loss (nearly 4%) occurs during the first anneal, which is not observed during the second or third anneals. This mass loss is believed to be due to the condensation of Si—OH groups and rearrangement of the silica network, which leads to a higher proportion of Si—O—Si groups after the anneal than before.

Further evidence of densification during annealing can be observed through TEM studies of the coated luminescent particles. FIGS. 13A-13D show TEM images of the coated luminescent particles after the annealing treatment. FIG. 14 shows a plot of the particle size distribution before and after annealing as determined from analysis of the TEM images. Before annealing, an average particle diameter of 23.4 nm is measured; after annealing, the average particle diameter drops to 21.2. This corresponds to a roughly 20% reduction in volume in this example. In general, a volume reduction of 5-25% is observed after annealing. The TEM images reveal no change in the size of the semiconductor quantum dot underlying the silica coating or shell, and thus the TEM data suggest that the densification is confined to the buffer layer.

Characterization of Buffer Layer

Unstabilized and stabilized (via annealing) quantum dot structures are studied using FTIR analysis to identify characteristics of densified buffer layers.

FTIR spectra are recorded using a FT-IR spectrometer operating in ATR mode. Untreated and annealed coated luminescent particles in the form of powdered samples are placed directly on the diamond ATR crystal, and compacted with an anvil prior to measurement. Spectra are background corrected and converted to absorption units and normalized to the highest peak before intensity ratios are determined. When no peak is present, as is the case for the silanol Si—OH signal for the treated, stable samples, the shoulder position is used instead. The peak assignments made in this investigation are conventional for silicate materials, as discussed in Brinker, C. J; Scherer, G. W., *Sol-Gel Science: The Physics and Chemistry of Sol-Gel Processing*, Academic Press Inc., 1990, pp. 541-546. An exemplary FTIR spectrum is shown in FIG. 10.

To develop quantitative criteria, four pairs of samples are measured before and after annealing and their spectra analyzed for significant differences. Three criteria are thus established to identify quantum dot structures that have a densified silica buffer layer, supported by the data shown below in Tables 1-3. Coated luminescent particle samples that satisfy one or more (or all) of these criteria may be understood to have undergone an annealing treatment as described above to densify the buffer layer produce a stabilized quantum dot structure.

Referring first to Table 1, the first criteria is that the ratio ($R=I_{1050}/I_{3300}$) of the peak intensity between the network (Si—O—Si) signal at about 1050 cm$^{-1}$ and the silanol SiO—H signal at about 3200-3400 cm$^{-1}$ (e.g., 3300 cm$^{-1}$) is at least about 35. As stated above, R may also be at least about 40, at least about 45, or at least about 50, and in some cases as high as 75, or as high as 65.

TABLE 1

Peak Intensity Ratios ($R = I_{1050}/I_{3300}$) for Untreated and Treated Quantum Dot Structures

| Pair | Ratio R—Untreated, unstable quantum dot structures | Ratio R—Treated, stable quantum dot structures |
| --- | --- | --- |
| 1 | 21.5 | 41.3 |
| 2 | 26.0 | 38.8 |
| 3 | 27.5 | 61.6 |
| 4 | 15.5 | 54.4 |

Referring now to Table 2, the second criteria is that the FTIR spectrum does not have a distinct silanol (Si—OH) intensity peak at about 950 cm$^{-1}$.

TABLE 2

Type of Feature at 950 cm$^{-1}$

| Pair | Feature Type—Untreated, unstable | Feature Type—Treated, stable |
| --- | --- | --- |
| 1 | Discrete peak | No discrete peak |
| 2 | Discrete peak | No discrete peak |
| 3 | Discrete peak | No discrete peak |
| 4 | Discrete peak | No discrete peak |

Referring now to Table 3, the third criteria is that the ratio ($R^*=I_{1050}/I_{950}$) of the peak intensity between the network (Si—O—Si) signal at about 1050 cm$^{-1}$ and the silanol (Si—OH) signal at about 950 cm$^{-1}$ is at least about 2.8. The ratio $R^*$ may also be at least about 3.0, at least about 3.2, or at least about 3.4, and typically the ratio $R^*$ is no greater than about 6, or no greater than about 5.

TABLE 3

Peak Intensity Ratios ($R^* = I_{1050}/I_{950}$) for Untreated and Treated Quantum Dot Structures

| Pair | Ratio R*—Untreated, unstable | Ratio R*—Treated, stable |
| --- | --- | --- |
| 1 | 2.2 | 3.2 |
| 2 | 2.6 | 2.9 |
| 3 | 2.6 | 4.3 |
| 4 | 1.9 | 3.4 |

Formation of Barrier Layer

Solution Phase Reaction. In this example, a zinc oxide barrier layer is formed on the coated particles described above using a solution phase reaction. An aqueous solution of a zinc precursor (e.g. $Zn(NO_3)_2$, $Zn(OAc)_2$, $ZnCl_2$) is prepared at a concentration of 10-500 mg/ml, with 100 mg/ml being typical. A separate aqueous solution of base is also prepared using, for example, potassium hydroxide, sodium hydroxide, or ammonium hydroxide at a concentration of 0.1-10.0 M. The zinc and base solutions are loaded into separate syringes then infused into the reaction vessel over a specified period of time, between 10 mins to 16 hours, with 1 hour being typical.

After infusion is complete, the reaction mixture is cooled to room temperature and purified/separated by centrifugation, depositing the CdSe/CdS/SiO$_2$/ZnO as a solid orange pellet. The clear, colorless supernatant is decanted. The solids are then washed two times with de-ionized H$_2$O and one time with methanol. The purified solids are suspended in minimal methanol, transferred to a vial, and dried in vacuo to a dry powder.

Figure 16A:
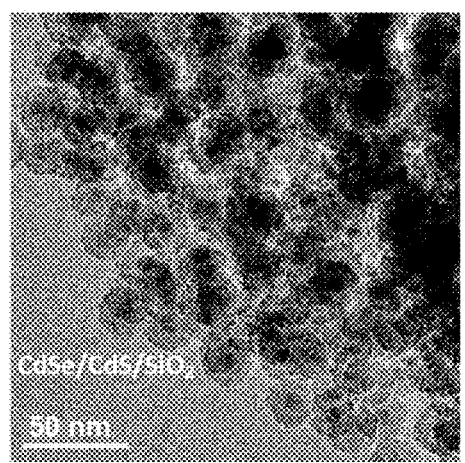
FIGS. 16A and 16B show quantum dot structures before and after the addition of a zinc oxide barrier layer by a solution phase coating process.
Figure 16B:
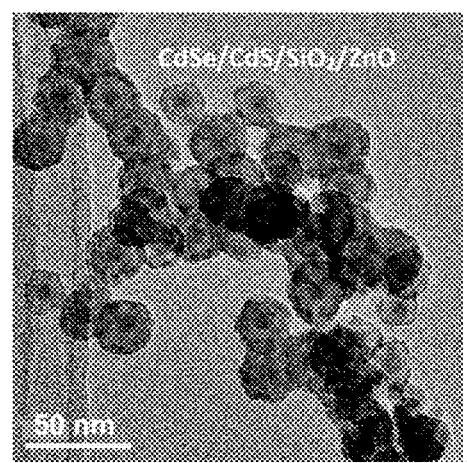

The TEM micrographs of FIGS. 16A and 16B show the quantum dot structures before (A) and after (B) the addition of zinc oxide by the solution phase coating process.

Vapor Phase Reaction.

In this example, zinc oxide and aluminum oxide barrier layers are formed on the coated particles described above using ALD. Doses of metal precursor (typically diethylzinc or trimethylaluminum) and oxygen precursor (water or oxygen) are alternated with dose times of 0.1-10 s (with 1 s typical) followed by a pumping cycle (to <100 mTorr) or purge after each metal or oxygen cycle of non-reactive gas (argon or nitrogen) for 0.1-300 s (with 60 s typical). The process is carried out at room temperature to 300° C. (typically 150° C.) for 5-500 cycles at pressures of about 1 Torr. Typically after 20 cycles the material is agitated (for example by mechanically grinding or moving the material) to full cover all sides of each QD. TEM images of the coated particles are shown in FIGS. 17A-17C (CdSe/CdS/SiO$_x$/Al$_2$O$_3$) and FIGS. 18A-18C (CdSe/CdS/SiO$_x$/ZnO). The same ALD conditions as described as typical conditions above were used to attempt to produce Al$_2$O$_3$ and ZnO barrier layers on luminescent particles comprising CdSe/CdS/ZnS, as shown in FIGS. 19A-19C and 20A-20C, respectively. The results show that the silica buffer layer allows for growth of a metal oxide barrier layer and inhibits degradation of the semiconducting material during ALD.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. A stabilized quantum dot structure for use in a light emitting device, the stabilized quantum dot structure comprising:
    a luminescent particle comprising one or more semiconductors;
    a buffer layer overlying the luminescent particle, the buffer layer comprising an amorphous material; and
    a barrier layer overlying the buffer layer, the barrier layer comprising oxygen, nitrogen and/or carbon.

2. The stabilized quantum dot structure of claim 1, wherein the amorphous material is selected from the group consisting of amorphous silica, amorphous titania, amorphous carbon, amorphous alumina, amorphous silicon oxycarbide, or an amorphous aluminosilicate.

3. The stabilized quantum dot structure of claim 1, wherein the barrier layer comprises an oxide, a carbide, a nitride, an oxynitride or an oxycarbide.

4. The stabilized quantum dot structure of claim 3, wherein the barrier layer comprises an insulating oxide selected from the group consisting of: aluminum oxide, zirconium oxide and hafnium oxide.

5. The stabilized quantum dot structure of claim 3, wherein the barrier layer comprises a semiconducting oxide selected from the group consisting of: zinc oxide, titanium dioxide, indium oxide, tin oxide, nickel oxide and copper oxide; or a conducting oxide selected from the group consisting of: indium-tin oxide, aluminum-doped zinc oxide, and gallium-doped zinc oxide.

6. The stabilized quantum dot structure of claim 3, wherein the barrier layer comprises: a nitride selected from the group consisting of silicon nitride, aluminum nitride, boron nitride, and gallium nitride; or a carbide selected from the group consisting of: silicon carbide and boron carbide.

7. The stabilized quantum dot structure of claim 1, wherein one or both of the buffer layer and the barrier layer are substantially transparent to visible light.

8. The stabilized quantum dot structure of claim 1, wherein the buffer layer further comprises an ionic species selected from the group consisting of K and Na, the buffer layer being a treated buffer layer.

9. The stabilized quantum dot structure of claim 1, wherein the buffer layer is a densified buffer layer comprising amorphous silica, an FTIR spectrum of the stabilized quantum dot structure exhibiting a peak intensity ratio $R=I_{1050}/I_{3300}$ of at least about 35, where $I_{1050}$ is a peak intensity at about 1050 cm$^{-1}$ and $I_{3300}$ is a peak intensity at about 3300 cm$^{-1}$.

10. The stabilized quantum dot structure of claim 1, wherein the luminescent particle comprises a core-shell structure including a semiconducting core and one or more semiconducting shells overlying the semiconducting core.

11. The stabilized quantum dot structure of claim 1, wherein each of the buffer layer and the barrier layer has a thickness of from about 2 nm to about 50 nm.

12. The stabilized quantum dot structure of claim 1, wherein the luminescent particle has a size of about 100 nm or less.

13. The stabilized quantum dot structure of claim 1 exhibiting a quantum yield of at least about 0.7 when exposed to a blue light flux of 30 W/cm$^2$ at a temperature of 80-85° C. and relative humidity of 5% for 500 hours.

14. A light emitting device comprising a blue light emitting diode (LED) chip having a dominant wavelength of 425 nm to 475 nm in optical communication with a plurality of the stabilized quantum dot structures of claim 1 for down conversion of light emitted from the blue LED chip.

* * * * *